(12) United States Patent
Shibayama

(10) Patent No.: US 7,826,695 B2
(45) Date of Patent: Nov. 2, 2010

(54) LIGHT TRANSMITTING/RECEIVING DEVICE

(75) Inventor: Katsumi Shibayama, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 79 days.

(21) Appl. No.: 12/301,142

(22) PCT Filed: May 15, 2007

(86) PCT No.: PCT/JP2007/059951
§ 371 (c)(1),
(2), (4) Date: Feb. 10, 2009

(87) PCT Pub. No.: WO2007/135897
PCT Pub. Date: Nov. 29, 2007

(65) Prior Publication Data
US 2009/0232451 A1    Sep. 17, 2009

(30) Foreign Application Priority Data
May 18, 2006    (JP)    .............................. 2006-139146

(51) Int. Cl.
*G02B 6/12* (2006.01)
*H04B 10/12* (2006.01)
*H04B 10/06* (2006.01)
(52) U.S. Cl. ........................ 385/14; 398/200; 398/214
(58) Field of Classification Search .................... 385/14
See application file for complete search history.

(56) References Cited
U.S. PATENT DOCUMENTS
6,807,326 B2 * 10/2004 Han et al. ..................... 385/14

7,192,200 B2 * 3/2007 Casati et al. .................. 385/89
2003/0091303 A1 * 5/2003 Kami et al. ................... 385/92
2003/0194168 A1 * 10/2003 Ouchi ......................... 385/14
2009/0202251 A1 * 8/2009 Shibayama ................. 398/138

FOREIGN PATENT DOCUMENTS

| JP | 2-26080 | 1/1990 |
|---|---|---|
| JP | 5-240701 | 9/1993 |
| JP | 2001-61796 | 3/2001 |
| JP | 2003-4855 | 1/2003 |
| JP | 2003-329895 | 11/2003 |
| JP | 2004-229920 | 8/2004 |
| JP | 2005-116670 | 4/2005 |

* cited by examiner

*Primary Examiner*—Rhonda S Peace
(74) *Attorney, Agent, or Firm*—Drinker Biddle & Reath LLP

(57) ABSTRACT

An optical transmitting and receiving device enabling incident light from an exterior to be detected with high precision is provided. With an optical transmitting and receiving device 1, a groove 28, passing between an opening 22 and a pinhole 23 as viewed from a front and having both ends open to side surfaces of a light transmitting member 27, is formed in a front surface 27a of the light transmitting member 27, and a light blocking resin portion 3 reaches an interior of the groove 28. Thus, even if a portion of light emitted from an LD 9 undergoes multiple reflection inside the light transmitting member 27, the multiply reflected light is prevented by the light blocking resin portion 3 in the groove 28 from reaching a PD 12 as unwanted light. Detection of noise current due to the unwanted light can thereby be prevented and incident light from the exterior can be detected with high precision.

8 Claims, 2 Drawing Sheets

LIGHT TRANSMITTING/RECEIVING DEVICE

TECHNICAL FIELD

The present invention relates to an optical transmitting and receiving device.

BACKGROUND ART

As a conventional optical transmitting and receiving device, there is known a device including: a light emitting element; a light receiving element; a base, housing the light emitting element and the light receiving element and having an opening; a light transmitting member, mounted on the opening of the base; and a light blocking member, disposed between the light emitting element and the light receiving element (see, for example, Patent Document 1).

Patent Document 1: Japanese Published Unexamined Patent Application No. 2001-61796

DISCLOSURE OF THE INVENTION

Problems to be Solved by the Invention

Due to its structure, the above-described optical transmitting and receiving device is required to have high precision in terms of dimensions, positions, etc., of the respective components. When the precision degrades even slightly, blocking of light between the light emitting element and the light receiving element may become inadequate. Specifically, a portion of light emitted from the light emitting element may undergo multiple reflection inside the light transmitting member, propagate inside the light transmitting member, and reach the light receiving element as unwanted light, and a noise current due to the unwanted light may increase, causing degradation of detection precision of scattered light, etc., entering from an exterior.

The present invention has been made in view of the above circumstances and an object thereof is to provide an optical transmitting and receiving device enabling detection of incident light from an exterior with high precision.

Means for Solving the Problem

To achieve the above object, an optical transmitting and receiving device according to the present invention includes: a main unit, in turn including a light emitting element, for emitting light toward a front, a light receiving element, for receiving light illuminated from the front, a base, having a first recess, in which the light emitting element is positioned, and a second recess, in which the light receiving element is positioned, formed on a front surface, a light blocking member, disposed on the front surface side of the base and having formed therein a first light passage hole, through which the light emitted from the light emitting element passes, and a second light passage hole, through which the light to be received by the light receiving element passes, and a light transmitting member, disposed on a front surface side of the light blocking member and through which is transmitted the light emitted from the light emitting element and the light to be received by the light receiving element; an enclosure, formed so as to open toward the front and with which the main unit is positioned at an inner side thereof, and a light blocking resin portion, filling a region surrounding the main unit inside the enclosure; there being formed in a front surface of the light transmitting member, a groove, passing between the first light passage hole and the second light passage hole as viewed from the front and having at least one end opened to a side surface of the light transmitting member, and the light blocking resin portion reaching an interior of the groove.

Also, an optical transmitting and receiving device according to the present invention includes: a main unit, in turn including a light emitting element, for emitting light toward a front, a light receiving element, for receiving light illuminated from the front, a base, having a recess, in which the light emitting element and the light receiving element are positioned, formed on a front surface, a light blocking member, disposed on the front surface side of the base and having formed therein a first light passage hole, through which the light emitted from the light emitting element passes, and a second light passage hole, through which the light to be received by the light receiving element passes, and a light transmitting member, disposed on a front surface side of the light blocking member and through which is transmitted the light emitted from the light emitting element and the light to be received by the light receiving element; an enclosure, formed so as to open toward the front and with which the main unit is positioned at an inner side thereof; and a light blocking resin portion, filling a region surrounding the main unit inside the enclosure; there being formed in a front surface of the light transmitting member, a groove, passing between the first light passage hole and the second light passage hole as viewed from the front and having at least one end opened to a side surface of the light transmitting member, and the light blocking resin portion reaching an interior of the groove.

With these optical transmitting and receiving devices, the groove, passing between the first light passage hole and the second light passage hole as viewed from the front and having at least one end opened to a side surface of the light transmitting member, is formed in the front surface of the light transmitting member, and the light blocking resin portion reaches the interior of the groove. Thus, even if a portion of the light emitted from the light emitting element undergoes multiple reflection inside the light transmitting member, the multiply reflected light is suppressed by the light blocking resin portion inside the groove from reaching the light receiving element. Detection of unwanted light due to multiple reflection as noise can thus be reduced and incident light from an exterior can be detected at high precision.

Here, preferably a deepest portion of the groove is positioned at the front surface or more to the rear than the front surface of the light blocking member. In this case, the blocking of light between the light emitting element and the light receiving element can be secured reliably.

Also preferably, the deepest portion of the groove is positioned more to the rear than a front end of the enclosure. In this case, when a light blocking resin is made to flow in up to the front end of the enclosure to form the light blocking resin portion, the light blocking resin can also be made to flow reliably and easily into the groove to make the light blocking resin portion reach the interior of the groove.

Preferably, the groove has both ends opened to side surfaces of the light transmitting member. The light blocking resin can thereby be made to flow more reliably and easily into the groove.

Effects of the Invention

With the present invention, incident light from the exterior can be detected with high precision.

Figure 1:
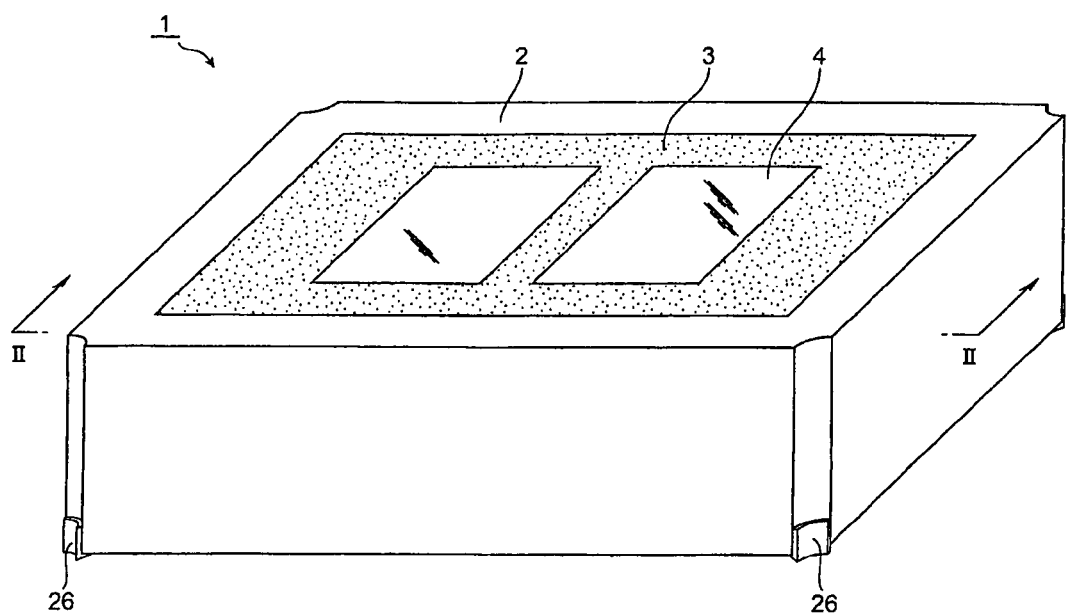
FIG. 1 is a perspective view of an optical transmitting and receiving device according to a first embodiment.

DESCRIPTION OF THE REFERENCE NUMERALS 1, 50 . . . Optical transmitting and receiving device,
2 . . . Enclosure,
3 . . . Light blocking resin portion,
4 . . . Main unit,
5 . . . Base,
7 . . . First cavity (first recess),
8 . . . Second cavity (second recess),
9 . . . LD (light emitting element),
12 . . . PD (light receiving element),
20 . . . Light blocking member,
22 . . . Opening (first light transmitting hole),
23 . . . Pinhole (second light transmitting hole),
27 . . . Light transmitting member,
28 . . . Groove,
30 . . . Cavity (recess).

BEST MODES FOR CARRYING OUT THE INVENTION

Preferred embodiments of the present invention shall now be described in detail with reference to the drawings. In the drawings, portions that are the same or equivalent shall be provided with the same symbol and redundant description shall be omitted.

First Embodiment

Figure 2:
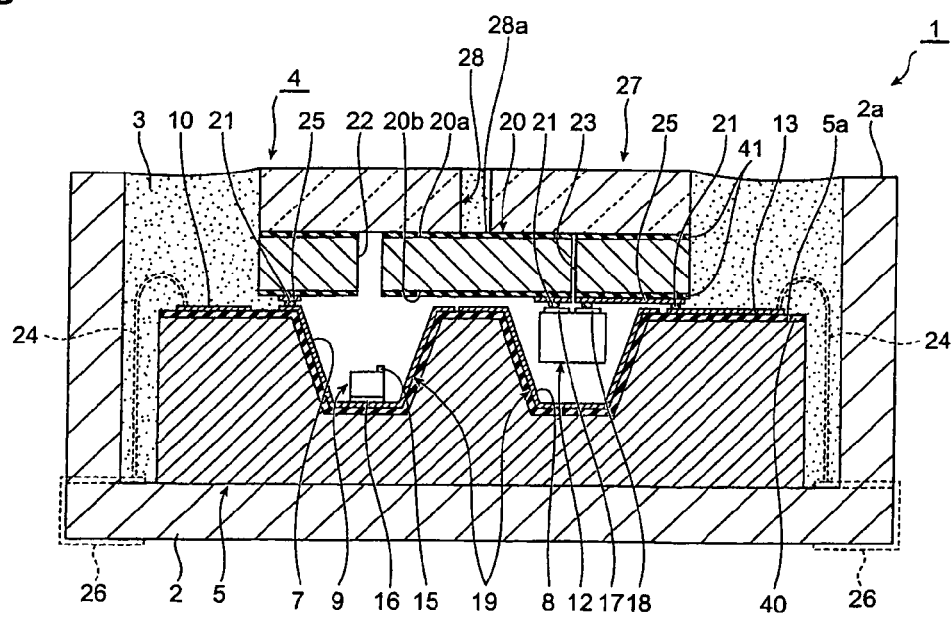
FIG. 2 is an end view taken along the line II-II shown in FIG. 1.

As shown in FIGS. 1 and 2, an optical transmitting and receiving device 1 according to a first embodiment includes an enclosure 2, formed of a plastic material to a form of a rectangular parallelepiped cup that opens to a front. Inside the enclosure 2 is disposed a main unit 4, incorporating an LD (light emitting element) 9, emitting light toward the front, and a PD (light receiving element) 12, receiving light illuminated from the front, and a peripheral region of the main unit 4 inside the enclosure 2 is filled with a light blocking resin portion 3, having a light blocking property. The light blocking resin portion 3 is constituted of a light blocking resin, such as a silicone resin containing an insulation-coated carbon filler, fixes the main unit 4 inside the enclosure 2, and reduces influence of disturbance light made incident onto the PD 12 from the periphery of the main unit 4.

Figure 3:
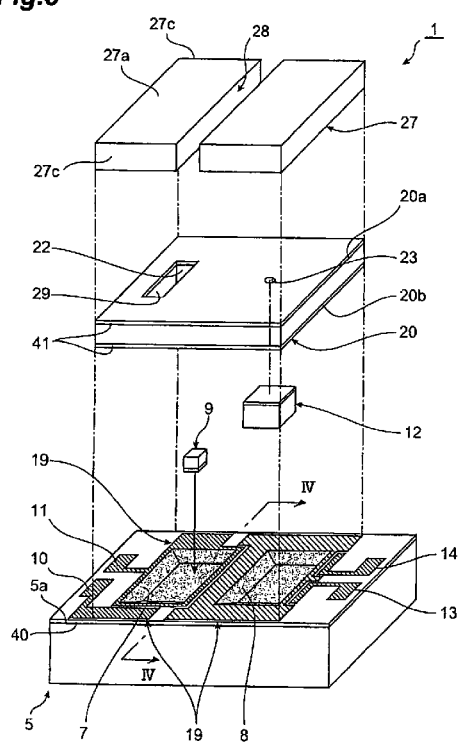
FIG. 3 is an exploded perspective view of a main unit of the optical transmitting and receiving device shown in FIG. 1.

As shown in FIGS. 2 and 3, the main unit 4 has a base 5 at a bottom surface side of an interior of the enclosure 2. The base 5 is formed of silicon, which is a semiconductor material, to a form of a rectangular plate with a width of 2.8 mm, a length of 6.0 mm, and a thickness of 11.0 mm, and a first cavity (first recess) 7 and a second cavity (first recess) 8 of recessed forms are formed in a front surface 5a of the base 5. The LD 9 is disposed inside the first cavity 7 and is electrically connected to an LD anode 10 and an LD cathode 11 to be described below. The PD 12 is disposed inside the second cavity 8 and is electrically connected to a PD anode 13 and a PD cathode 14 to be described below.

The cavities 7 and 8 are formed, for example, by applying wet etching to a silicon substrate that is to be the base 5. Specifically, the cavities 7 and 8 are formed by setting a mask, formed of SiN, etc., and being for defining the shapes of the cavities 7 and 8, on a top surface of the silicon substrate to be the base 5 and making an etchant act on openings of the mask. After etching, the SiN mask is removed and thereafter, an insulating film 40, formed for example of $SiO_2$ and having a thickness of 1.5 μm, is formed by thermal oxidation on at least surfaces of the cavities and a surface of the substrate.

The LD 9 uses, for example, a VCSEL (surface emitting laser), constituted of a compound semiconductor material and having a thickness of 0.2 mm, and emits light of a wavelength of 850 nm. With the LD 9, an LD terminal electrode 15 is disposed on a front end surface and an LD terminal electrode 16 is disposed on a rear end surface. The PD 12 uses, for example, an Si-PD or a GaAs-PD, constituted of a semiconductor material and having a thickness of 0.3 mm. With the PD 12, a PD terminal electrode 17 and a PD terminal electrode 18 is disposed on a front end surface.

The material of the PD 12 is selected according to the wavelength of the light emitted by the LD 9. For example, when the wavelength of the light emitted by the LD 9 is 780 nm, Si or GaAs is used as the material of PD 12, and when the wavelength of the light emitted by the LD 9 is 1.31 μm, InGaAs is used as the material of PD 12.

On the insulating film 40 on the front surface 5a of the substrate 5 and inner surfaces of the cavities 7 and 8, a base wiring portion 19 is formed in a predetermined pattern, for example, from a laminated film of Al, Ti—Pt—Au or a laminated film of Cr—Pt—Au. The base wiring portion 19 has the LD anode 10 and the LD cathode 11 at the first cavity 7 side, and has the PD anode 13 and the PD cathode 14 at the second cavity 8 side. As shown in FIGS. 1 and 2, the LD anode 10, the LD cathode 11, the PD anode 13, and the PD cathode 14 are electrically connected via wires 24 to lead-out electrodes 26, formed at four corners of a bottom portion of the enclosure 2 so as to lead out the electrodes from a front surface to a rear surface of the bottom portion. The LD terminal electrode 16 of the LD 9 is electrically connected, for example, via solder or conductive resin, etc., to the base wiring portion 19 formed on the insulating film 40 on a bottom surface of the first cavity 7, and the LD terminal electrode 15 of the LD 9 is electrically connected, for example, via a wire (not shown), to the base wiring portion 19 formed on the insulating film 40 on the front surface 5a of the base 5. The LD 9 is thereby electrically connected to the LD anode 10 and the LD cathode 11, respectively.

Returning now to FIGS. 2 and 3, a light blocking member 20, formed, for example, by forming a silicon substrate, coated with insulating films 41 constituted of $SiO_2$, to a rectangular plate form with a thickness of 0.15 mm to 0.30 mm, is laminated and fixed by a bump bond 21 on the insulating film 40 on the front surface 5a of the base 5. As examples of a material of the bump bond 21, Au-, Ni-, Cu-, AuSn-, and SnAg-based solders can be cited. Here, the bump bond 21 is preferably lined along a portion between the first cavity 7 and the second cavity 8 to prevent light, emitted from the LD 9, from reaching the PD 12 via a gap between the substrate 5 and the light blocking member 20. A light blocking portion may be formed at this portion by coating or filling with a light blocking material.

In the light blocking member 20 are formed an opening (first light transmitting hole) 22, disposed at a position corresponding to the first cavity 7, and a pinhole (second light transmitting hole) 23, disposed at a position corresponding to the second cavity 8. The opening 22 guides the light, emitted from the LD 9, to an exterior. The pinhole 23 guides scattered light from the exterior to the PD 12 and prevents entry of disturbance light and unwanted light from the exterior from becoming incident on the PD 12. The opening 22 and the pinhole 23 are formed, for example, by applying dry etching to the silicon substrate that is to be the light blocking member 20, and the pinhole 23 is configured to have a high aspect ratio.

The pinhole 23 is formed at a position corresponding to a light receiving surface of the PD 12 and a diameter thereof is set, for example, to 30 μm to 90 μm. This is because when the diameter of the pinhole 23 is greater than 90 μm, noise, due to disturbance light and unwanted light from the exterior that are detected by the PD 12, increases, and because when the diameter of the pinhole 23 is less than 30 μm, the light received by the PD 12 lessens and an output from the PD 12 lessens.

On the insulating film 41 on a rear surface 20b of the light blocking member 20, a light blocking member wiring portion 25 is formed in a predetermined pattern and is electrically connected via the bump bond 21 to the base wiring portion 19. The PD terminal electrodes 17 and 18 of the PD 12 are electrically connected by the bump bonds 21 (by so-called flip-chip bonding) to portions of the light blocking member wiring portion 25 corresponding to the second cavity 8. The PD 12 is thereby electrically connected to the PD anode 13 and the PD cathode 14, respectively.

A light transmitting member 27, formed, for example, by forming an alkali-containing borosilicate glass to a rectangular plate form with a thickness of 0.3 mm for transmission of the light emitted from the LD 9 and the scattered light from the exterior, is laminated and fixed by a resin on the insulating film 41 on a front surface 20a of the light blocking member 20. The light transmitting member 27 increases a mechanical strength of the light blocking member 20 and seals and thereby packages the first cavity 7 and the second cavity 8 of the base 5. Because the light transmitting member 27 is fixed to the light blocking member 20, a thermal expansion coefficient of the light transmitting member 27 and a thermal expansion coefficient of the light blocking member 20 are made substantially equal. The light blocking member 20 and the light transmitting member 27 may be fixed by anodic bonding, and in this case, the insulating film 41 is made unnecessary.

Here, whereas with the conventional optical transmitting and receiving device, it was difficult to fix the light transmitting member and there were thus cases where disturbance light became incident on the light receiving element due to inadequate fixing of the light transmitting member, with the present embodiment, the light transmitting member 27 is laminated and fixed on the front surface 20a of the light blocking member 20 and the peripheral region of the main unit 4 inside the enclosure 2 is filled with the light blocking resin portion 3 to reliably fix the light transmitting member 27 as described above.

With the light transmitting and receiving device 1, a groove 28, passing between the opening 22 and the pinhole 23 as viewed from the front (upper side in the figure) and having both ends open to side surfaces 27c of the light transmitting member 27, is formed in a front surface 27a of the light transmitting member 27, and the light blocking resin portion 3 reaches an interior of the groove 28. The groove 28 is formed, for example, by a dicing process, a width thereof is 100 μm to 200 μm, and a bottom surface (deepest portion) 28a thereof is the front surface 20a of the light blocking member 20.

The bottom surface 28a of the groove 28 is positioned more to the rear (toward the lower side in the figure) than a front end surface (front end) 2a of the enclosure 2. Thus, when the light blocking resin is made to flow in up to the front end surface 2a of the enclosure 2 to form the light blocking resin portion 3, the light blocking resin can be made to flow in reliably and easily into the groove 28 from both ends thereof by a capillary phenomenon and the light blocking resin portion 3 can thereby be made to reach the interior of the groove 28.

Here, the light blocking resin is made to flow in up to the front end surface 2a of the enclosure 2, and in order to prevent attachment of the light blocking resin on the front surface 27a of the light transmitting member 27, the front surface 27a of the light transmitting member 27 is positioned more to the front than the front end surface 2a of the enclosure 2.

In using the optical transmitting and receiving device 1 configured as described above, first, a voltage is applied to the LD anode 10 and the LD cathode 11 of the base wiring portion 19 to make light be emitted from the LD 9, disposed inside the first cavity 7 of the base 5. The light passes through the opening 22, formed in the light blocking member 20, and is emitted to the exterior upon being transmitted through the light transmitting member 27. The light emitted to the exterior is scattered, etc., by an object, and a portion of scattered light thus scattered propagates in a direction opposite a direction of propagation of the light emitted from the LD 9 and is transmitted through the light transmitting member 27, passes through the pinhole 23 formed in the light blocking member 20, and reaches the PD 12, disposed in the second cavity 8 of the base 5. An electric signal that is in accordance to the arrived light is thus obtained from the PD anode 13 and the PD cathode 14 of the base wiring portion 19.

As described above, with the optical transmitting and receiving device 1 according to the first embodiment, the groove 28, passing between the opening 22 and the pinhole 23 as viewed from the front and having both ends open to the side surfaces 27c of the light transmitting member 27, is formed on the front surface 27a of the light transmitting member 27, and the light blocking resin portion 3 reaches the interior of the groove 28. Thus, even if a portion of the light emitted from the LD 9 undergoes multiple reflection inside the light transmitting member 27, the multiply reflected light is prevented by the light blocking resin portion 3 in the groove 28 from reaching the PD 12 as unwanted light. Detection of noise current due to the unwanted light can thereby be prevented and incident light from the exterior can be detected with high precision.

Furthermore, by the bottom surface 28a of the groove 28 being positioned at the front surface 20a of the light blocking member 20, blocking of light between the LD 9 and the PD 12 can be secured reliably.

Also, by forming the lead-out electrodes 26 at the four corners of the bottom portion of the enclosure 2 so as to lead out the electrodes from the front surface to the rear surface of the bottom portion, application of voltage to the light emitting element and take-out of an electrical signal from the light receiving element, which were problematic with the conventional optical transmitting and receiving device, can be performed favorably.

Second Embodiment

Figure 4:
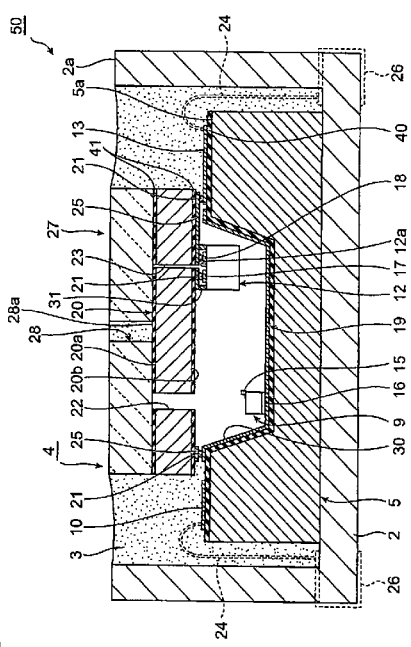
FIG. 4 is an end view, corresponding to FIG. 2, of an optical transmitting and receiving device according to a second embodiment.

An optical transmitting and receiving device 50 according to a second embodiment differs from the optical transmitting and receiving device 1 according to the first embodiment in the shape of the base 5. That is, with the optical transmitting and receiving device 50 according to the second embodiment, a cavity (recess) 30, in which the LD 9 and the PD 12 are disposed, is formed in the front surface 5a of the base 5 as shown in FIG. 4. A light blocking portion 31, formed of a light blocking resin, is disposed between the light blocking member 20 and the PD 12 so as to surround a light receiving surface 12a of the PD 12. Incidence of disturbance light and unwanted light due to emitted light from the LD 9, etc., onto the PD 12 is thereby prevented.

The same actions and effects as those of the optical transmitting and receiving device 1 according to the first embodiment are also exhibited by the optical transmitting and receiving device 50 according to the second embodiment configured as described above.

Although preferred embodiments of the present invention were described above, the present invention is not limited to the above embodiments.

For example, although with the above-described embodiments, both ends of the groove 28 open to the side surfaces 27 of the light transmitting member 27, as long as one end of the groove 28 is opened to the side surface 27c, the light blocking resin can be made to flow reliably and easily into the groove 28 in making the light blocking resin flow inside the enclosure 2 to form the light blocking resin portion 3, and the light blocking resin portion 3 can thereby be made to reach the interior of the groove 28.

Also, although with the above-described embodiments, the bottom surface 28a of the groove 28 is made the front surface 20a of the light blocking member 20, the bottom surface 28a may be positioned more to the rear than the front surface 20a instead.

INDUSTRIAL APPLICABILITY

With the present invention, incident light from an exterior can be detected with high precision.

The invention claimed is:

1. An optical transmitting and receiving device comprising: a main unit, in turn comprising:
    a light emitting element, for emitting light toward a front;
    a light receiving element, for receiving light illuminated from the front;
    a base, having a first recess, in which the light emitting element is positioned, and a second recess, in which the light receiving element is positioned, formed on a front surface;
    a light blocking member, disposed on the front surface side of the base and having formed therein a first light passage hole, through which the light emitted from the light emitting element passes, and a second light passage hole, through which the light to be received by the light receiving element passes; and
    a light transmitting member, disposed on a front surface side of the light blocking member and through which is transmitted the light emitted from the light emitting element and the light to be received by the light receiving element;
    an enclosure, formed so as to open toward the front and with which the main unit is positioned at an inner side thereof; and
    a light blocking resin portion, filling a region surrounding the main unit inside the enclosure;
    wherein a groove, passing between the first light passage hole and the second light passage hole as viewed from the front and having at least one end opened to a side surface of the light transmitting member, is formed in a front surface of the light transmitting member, and
    the light blocking resin portion reaches an interior of the groove.

2. The optical transmitting and receiving device according to claim 1, wherein a deepest portion of the groove is positioned at the front surface or more to the rear than the front surface of the light blocking member.

3. The optical transmitting and receiving device according to claim 1, wherein the deepest portion of the groove is positioned more to the rear than a front end of the enclosure.

4. The optical transmitting and receiving device according to claim 1, wherein the groove has both ends opened to side surfaces of the light transmitting member.

5. An optical transmitting and receiving device comprising: a main unit, in turn comprising:
    a light emitting element, for emitting light toward a front;
    a light receiving element, for receiving light illuminated from the front;
    a base, having a recess, in which the light emitting element and the light receiving element are positioned, formed on a front surface;
    a light blocking member, disposed on the front surface side of the base and having formed therein a first light passage hole, through which the light emitted from the light emitting element passes, and a second light passage hole, through which the light to be received by the light receiving element passes; and
    a light transmitting member, disposed on a front surface side of the light blocking member and through which is transmitted the light emitted from the light emitting element and the light to be received by the light receiving element;
    an enclosure, formed so as to open toward the front and with which the main unit is positioned at an inner side thereof; and
    a light blocking resin portion, filling a region surrounding the main unit inside the enclosure;
    wherein a groove, passing between the first light passage hole and the second light passage hole as viewed from the front and having at least one end opened to a side surface of the light transmitting member, is formed in a front surface of the light transmitting member, and
    the light blocking resin portion reaches an interior of the groove.

6. The optical transmitting and receiving device according to claim 5, wherein a deepest portion of the groove is positioned at the front surface or more to the rear than the front surface of the light blocking member.

7. The optical transmitting and receiving device according to claim 5, wherein the deepest portion of the groove is positioned more to the rear than a front end of the enclosure.

8. The optical transmitting and receiving device according to claim 5, wherein the groove has both ends opened to side surfaces of the light transmitting member.

* * * * *